(12) United States Patent
Goldbach et al.

(10) Patent No.: US 6,780,337 B2
(45) Date of Patent: Aug. 24, 2004

(54) METHOD FOR TRENCH ETCHING

(75) Inventors: Matthias Goldbach, Dresden (DE); Peter Moll, Dresden (DE)

(73) Assignee: Infineon Technologies AG, Munich (DE)

( * ) Notice: Subject to any disclaimer, the term of this patent is extended or adjusted under 35 U.S.C. 154(b) by 106 days.

(21) Appl. No.: 10/321,185

(22) Filed: Dec. 17, 2002

(65) Prior Publication Data

US 2003/0116532 A1 Jun. 26, 2003

(30) Foreign Application Priority Data

Dec. 17, 2001 (DE) .......................................... 101 62 065

(51) Int. Cl.$^7$ ......................................... H01L 21/3065
(52) U.S. Cl. ................... 216/2; 216/6; 216/37; 216/46; 216/67; 438/695; 438/696; 438/702
(58) Field of Search ............................ 216/2, 6, 37, 46, 216/67; 438/695, 696, 702

(56) References Cited

U.S. PATENT DOCUMENTS

| | | | | |
|---|---|---|---|---|
| 4,855,017 A | * | 8/1989 | Douglas | .................... 438/695 |
| 5,426,070 A | * | 6/1995 | Shaw et al. | .................... 216/2 |
| 5,780,346 A | * | 7/1998 | Arghavani et al. | .......... 438/296 |
| 5,801,417 A | * | 9/1998 | Tsang et al. | ................ 257/333 |
| 5,837,615 A | * | 11/1998 | Rostoker | ..................... 438/711 |
| 6,284,666 B1 | | 9/2001 | Naeem et al. | .............. 438/713 |

* cited by examiner

Primary Examiner—Allan Olsen
(74) Attorney, Agent, or Firm—Baker Botts LLP

(57) ABSTRACT

The invention relates to a method for trench etching, in particular a method for anisotropic deep trench (DT) etching in an Si substrate by plasma dry etching, such as reactive ion etching (RIE), magnetically enhanced RIE or inductively coupled plasma etching (ICP), and sidewall passivation of the etched trenches in the Si substrate, the Si substrate being provided with an etching mask before the beginning of the etching operation. The invention is intended to provide a method for depth etching which, with a low outlay, makes it possible to achieve a significantly larger etching depth at higher speed and which enables a further reduction of the structure widths without any difficulty. This is achieved by virtue of the fact that a DT etching step into the Si substrate (2) as far as a predetermined etching depth is performed, in that the redeposit (4) produced during the DT etching step is replaced by a protective layer for the sidewall passivation, and in that the sequence of these steps is repeated until the envisaged target depth of the trench (3) is reached, a break-through (6) being etched through the protective layer at the bottom of the trench (3) before each further DT etching step.

15 Claims, 1 Drawing Sheet

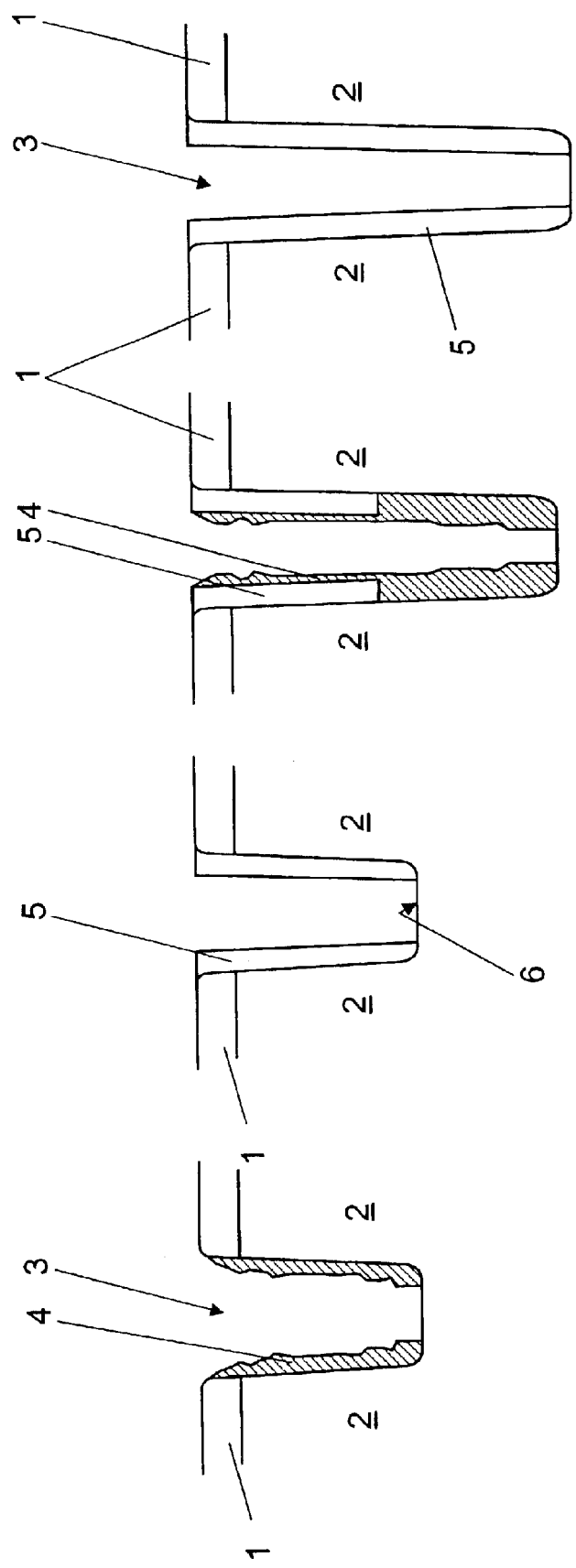

METHOD FOR TRENCH ETCHING

The invention relates to a method for trench etching, in particular a method for anisotropic deep trench (DT) etching in an Si substrate by plasma dry etching, such as reactive ion etching (RIE), magnetically enhanced RIE or inductively coupled plasma etching (ICP), and sidewall passivation of the etched trenches in the Si substrate, the Si substrate being provided with an etching mask before the beginning of the etching operation.

BACKGROUND OF THE INVENTION

Trench structures of this type are used in semiconductor structures, in particular in memory cells, in order to produce capacitances as storage medium. The etching operation is carried out for example in a dry etching installation with an inductively coupled plasma for activating the etching gases. Halogen-containing gases such as SF6, CF4, CHF3, Cl2, HBr, etc. are generally used as etching gases. A reactive ion etching method (RIE) of this type makes it possible to achieve etching depths of up to 50 µm. The Internet publication by IMSAS, University of Bremen, entitled "Volumen-Mikromechanik" ["Bulk micromachining"], author: Feld, Udo, (http://www.imsas.uni-bremen.de), dated Jun. 9, 1998, describes an etching method which makes it possible to achieve such and larger etching depths using a so-called advanced silicon etch method. However, this method is suitable specifically for producing deep silicon structures for micromachining and has a high selectivity with respect to positive photoresist and also with respect to oxide masks. Possibilities for simultaneous sidewall passivation are not specified here, however.

SUMMARY OF THE INVENTION

The document "EEP-Vol. 19-1, Advances in electronic packaging, 1997, Volume 1, ASME 1997, describes a device which is suitable for etching deep trenches and serves for reactive ion etching (RIE), particularly high etching rates being achieved using an inductively coupled plasma (ICP). In particular, a so-called "Bosch technology" is described which can be used to achieve larger etching depths by comparison with the RIE and ICP methods. This method uses SF6 as etching gas, and a particularly high concentration of atomic fluorine can be produced by the said SF6 in the plasma. This method is characterized in that etching and deposition steps alternate with one another. During the deposition cycle, a polymer protective layer is built up on the perpendicular sidewalk of the trench, which layer is intended to prevent incipient etching of the sidewalls during the etching step. Etching depths as far as 100 µm can be achieved with this method. However, this method is relatively complex and has the particular disadvantage that in the case of very small structure widths, during the deposition cycle, the mask opening is constricted to an excessively great extent by the polymer layer.

As already set forth, deep trench structures are used in the Si substrate in order to produce capacitances. As is known, however, the capacitance of a capacitor is dependent on the capacitor area. If the intention is to produce such capacitances with a sufficient capacitance in silicon structures, then a problem arises from the fact that, as structure sizes become ever smaller, it is necessary to etch ever deeper trenches into the silicon in order to achieve a comparable or else at least usable capacitance.

In the case of the deep trench etching methods that are customarily used, the trench is etched in its entire depth such that a sidewall passivation is continuously built up in the already etched region, in order to prevent etching into the sidewall of the trench. This is done by the selection of suitable recipe parameters. The sidewall passivation is produced by the SiBr4 which is produced during the Si etching and reacts with O2 in the plasma to form a non-volatile SiBrO, which is then deposited on the sidewalk as a loose layer (redeposit). However, there is no possibility for preventing the already produced sidewall passivation from being attacked while the etching process progresses, i.e. the already produced sidewall passivation is etched away or thinned for lack of sufficient selectivity of the etching gases used. It must therefore be ensured throughout the etching process that the sidewall passivation in the already etched region does not become too thin, or that so-called side pockets with the risk of a short circuit to adjacent structures are produced, or that a higher leakage rate is to be recorded.

In order to avoid this problem, it is possible, in principle, to use a suitable recipe to produce a significant reinforcement of the sidewall passivation. This involves the risk, however, of the sidewall passivation becoming too thick, that is to say of the trench opening being constricted to an excessively great extent, so that the further depth etching is then prevented or at least impeded.

Taking account of all these boundary conditions leads to a considerable restriction in the selection and optimization of the recipe parameters and the hardware.

In order to be able to etch deeper trenches, as already described, multistep etching methods have also been disclosed, the sidewall passivation for the uncovered silicon sidewalk in this case being built up during the etching process. In order in this case to prevent or to reduce incipient sidewall etching, the recipe parameters have to be adapted at the expense of the etching rate.

The invention is based on the object, then, of providing a method for depth etching which, with a low outlay, makes it possible to achieve a significantly larger etching depth at higher speed and which enables a further reduction of the structure widths without any difficulty.

According to the invention, the object of the invention is achieved, in the case of a method of the type mentioned in the introduction, by virtue of the fact that a deep trench (DT) etching step into the Si substrate as far as a predetermined etching depth is performed, in that the redeposit produced during the DT etching step is replaced by a protective layer for the sidewall passivation, and in that the sequence of these steps is repeated until the envisaged target depth of the trench is reached, a break-through being etched through the protective layer at the bottom of the trench before each further DT etching step.

The particular advantage of this method is to be seen in the fact that the separation of etching step and passivation step results in a particularly good sidewall protection which allows the use of significantly more aggressive etching parameters, which enables deeper etching trenches to be produced. The removal of the redeposit after each etching step means that the opening of the etching trench does not remain greatly restricted, but rather is repeatedly widened. This also improves the transporting of the reactive etching gases into the trench and thus has a positive influence on the etching rate.

The loose redeposit can be removed in a simple manner by a wet etching step.

The required protective layer is advantageously produced from a thermal oxide (SiO2) by a thermal oxidation, as a result of which the sidewall roughness of the Si, which was produced as a result of plasma etching damage, is simultaneously annealed again.

Instead of the thermal oxide as protective layer, the latter can also be produced from a conformally deposited metal.

It furthermore suffices for the thickness of the protective layer to be 2–5 nm.

In an advantageous refinement of the invention, the breakthrough etching step is carried out in situ before the DT etching step.

DESCRIPTION OF THE DRAWINGS

In a further continuation of the invention, instead of or in addition to the protective layer, an SiN layer is deposited as functional layer, so that an additional function can be fulfilled in the respective depth.

The invention will be explained in more detail below using an exemplary embodiment. In the associated figures of the drawing, in a diagrammatic illustration:

FIG. 1 shows the trench after a first depth etching step with simultaneous deposition of a redeposit;

FIG. 2 shows the trench according to FIG. 1, in the case of which the redeposit has been replaced by a thermal oxide and opened at the bottom by a break-through;

FIG. 3 shows the trench after a further depth etching step with deposited redeposit; and FIG. 4 shows the deep trench after its completion with sidewall passivation.

According to the invention, the deep trench etching into the Si substrate 2 provided with an etching mask 1 is divided into a plurality of steps. This means that now the etched trench 3 is modified between the individual etching steps in such a way that a subsequent etching can proceed more advantageously. In practice, this means that the redeposit 4 (loose SiO2) produced after the respective partial etching is removed and replaced by a thin thermally deposited oxide 5 for sidewall protection. The redeposit 4 can be removed in a simple manner by an additional wet etching step. This results in a significantly better sidewall protection which allows the use of significantly more aggressive etching parameters during the subsequent etching step, that is to say makes it possible to achieve an acceleration of the etching and, at the same time, to be able to produce deeper etching trenches.

By virtue of this method, a sidewall roughness of the Si that is otherwise present, caused as a result of plasma etching damage, is also annealed by the thermal oxide 5. The thermal oxide 5 is extremely resistant and produces a highly defined saturated surface. The advantage of this method is to be seen in the fact that the thermally produced oxide 5 (SiO2) yields the passivation which does not first have to be built up again and again, but rather is always immediately available. It appears to be sufficient to produce 2–5 nm of oxide. Furthermore, thickness fluctuations are also not critical for subsequent trench etching steps.

However, before each trench etching step, it is necessary to perform a break-through 6 at the bottom of the trench 3, which can be done in situ.

However, other protective layers are also conceivable if an additional function also has to be fulfilled in the respective depth of the trench 3. By way of example, it may be conceivable also to deposit an SiN layer, so that the latter can later be used as a protective layer. The protective layer may likewise be composed of a conformally deposited metal.

The step of removing the loose redeposit layer 4, which step precedes the build-up of the oxide layer 5, has the effect that the diameter at the upper edge of the trench 3 does not remain greatly restricted, but rather is repeatedly widened. This improves the transporting of the reactive ions into the trench and thus exercises a positive influence on the etching rate.

We claim:

1. In a method for deep trench etching in a Si substrate, using plasma dry etching, wherein the substrate is provided with an etching mask, and wherein sidewalls of the etched trench are passivated, the improvement wherein:

(a) a deep trench etching to a predetermined etching depth is performed; and (b) redeposit material produced during etching is replaced with a protective layer for sidewall passivation;

wherein steps (a) and (b) are repeated until a target depth for the trench is achieved, and wherein a break-through is etched through the protective layer at the bottom of the trench before each further deep trench etching step.

2. The improvement specified in claim 1 wherein the protective layer is an oxide produced by thermal oxidation.

3. The improvement specified in claim 2 wherein the protective layer has a thickness of 2–5 nm.

4. The improvement specified in claim 1 wherein the protective layer is a conformally deposited metal.

5. The improvement specified in claim 4 wherein the protective layer has a thickness of 2–5 nm.

6. The improvement specified in claim 1 wherein the protective layer is a deposited SiN layer.

7. The improvement specified in claim 6 wherein the protective layer has a thickness of 2–5 nm.

8. The improvement specified in claim 1 wherein the break-through is carried out in-situ before the subsequent deep trench etching step.

9. The improvement specified in claim 1 wherein the redeposit is removed by a wet etching step.

10. The improvement specified in claim 9 wherein the protective layer is an oxide produced by thermal oxidation.

11. The improvement specified in claim 10 wherein the protective layer has a thickness of 2–5 nm.

12. The improvement specified in claim 9 wherein the protective layer is a conformally deposited metal.

13. The improvement specified in claim 12 wherein the protective layer has a thickness of 2–5 nm.

14. The improvement specified in claim 9 wherein the protective layer is a deposited SiN layer.

15. The improvement specified in claim 14 wherein the protective layer has a thickness of 2–5 nm.

* * * * *